(12) United States Patent
Lu et al.

(10) Patent No.: US 11,677,396 B2
(45) Date of Patent: Jun. 13, 2023

(54) HYBRID POWER STAGE AND GATE DRIVER CIRCUIT

(71) Applicant: GaN Systems Inc., Ottawa (CA)

(72) Inventors: Juncheng Lu, Kanata (CA); Larry Spaziani, Chelmsford, MA (US)

(73) Assignee: GaN Systems Inc., Kanata (CA)

( * ) Notice: Subject to any disclaimer, the term of this patent is extended or adjusted under 35 U.S.C. 154(b) by 0 days.

(21) Appl. No.: 17/123,316

(22) Filed: Dec. 16, 2020

(65) Prior Publication Data

US 2022/0190825 A1 Jun. 16, 2022

(51) Int. Cl.
*H03K 17/687* (2006.01)
*H03K 17/567* (2006.01)

(52) U.S. Cl.
CPC ....... *H03K 17/6871* (2013.01); *H03K 17/567* (2013.01); *H03K 2217/0063* (2013.01); *H03K 2217/0072* (2013.01); *H03K 2217/0081* (2013.01)

(58) Field of Classification Search
CPC ............. H03K 17/6871; H03K 17/567; H03K 2217/0063; H03K 2217/0072; H03K 2217/0081
USPC ........................................................ 327/109
See application file for complete search history.

(56) References Cited

U.S. PATENT DOCUMENTS

| | | | |
|---|---|---|---|
| 5,635,867 A | 6/1997 | Timm | |
| 6,094,087 A | 7/2000 | He et al. | |
| 8,558,587 B2 | 10/2013 | Machida et al. | |
| 9,735,771 B1* | 8/2017 | Lu | ........................ H01L 29/16 |
| 9,754,937 B1 | 9/2017 | Lu | |
| 9,755,639 B2 | 9/2017 | Kampl et al. | |
| 9,954,522 B2 | 4/2018 | Lu et al. | |
| 10,348,286 B2 | 7/2019 | Chuang | |
| 10,756,722 B2 | 8/2020 | Korner | |
| 2003/0038615 A1* | 2/2003 | Elbanhawy | ........ H03K 17/6871 323/282 |

(Continued)

FOREIGN PATENT DOCUMENTS

| | | |
|---|---|---|
| JP | 2010-051165 | 3/2010 |
| WO | 2020031111 | 2/2020 |

OTHER PUBLICATIONS

Toru et al. "Stable cascode GaN HEMT operation by direct gate drive"; Sep. 13-20, 2020; 4 pages.*

(Continued)

*Primary Examiner* — Metasebia T Retebo
(74) *Attorney, Agent, or Firm* — Miltons IP/p.i.

(57) ABSTRACT

Hybrid power switching stages and driver circuits are disclosed. An example semiconductor power switching device comprises a high-side switch and a low-side switch connected in a half-bridge configuration, wherein the high-side switch comprises a GaN power transistor and the low-side switch comprises a Si MOSFET. The Si—GaN hybrid switching stage provides enhanced performance, e.g. reduced switching losses, in a cost-effective solution which takes advantage of characteristics of power switching devices comprising both GaN power transistors and Si MOSFETs. Also disclosed is a gate driver for the Si—GaN hybrid switching stage, and a semiconductor power switching stage comprising the gate driver and a Si—GaN hybrid power switching device having a half-bridge or full-bridge switching topology.

17 Claims, 5 Drawing Sheets

Si-GaN Hybrid half-bridge and driver circuit

(56) References Cited

U.S. PATENT DOCUMENTS

| | | |
|---|---|---|
| 2011/0285447 A1 | 11/2011 | Nakanishi |
| 2016/0043072 A1* | 2/2016 | Vielemeyer ........ H03K 17/6871 327/109 |
| 2016/0261266 A1 | 9/2016 | Kampl et al. |

OTHER PUBLICATIONS

Christoph et al. "Balancing the Switching Losses of Paralleled SiC MOSFETs Using an Intelligent Gate Driver"; PCIM Asia; Nov. 16-18, 2020.*

Burkard et al. "Paralleling GaN switches for low voltage high current half-bridges"; ECCE; Sep. 29-Oct. 3, 2019.*

Qiu, Y. et al.; "Using MOSFET Controllers to Drive GaN E-HEMTs", Bodo's Power Systems; Aug. 2019; 3 pages.

GaN Systems Inc.; Application Note GN001 Rev Oct. 21, 2014, "How to Drive GaN Enhancement Mode Power Switching Transistors"; pp. 1-13.

GaN Systems Inc.; Application Note GN010 "EZDrive® Power Stage Solution for GaN Systems' GaN Transistor"; Jun. 2020; 27 pages.

Balogh, L.; "Design and Application Guide for High Speed MOSFET Gate Drive Circuits"; Seminar 1400 Topic 2 High-Speed MOSFET Gate Drive Circuits, Texas Instruments v. 2001-2002; pp. 1-40.

Wrzecionka, B. et al.; "Novel AC-Coupled Gate Driver for Ultrafast Switching of Normally Off SiC JFETs,"; IEEE Transactions on Power Electronics, vol. 27, No. 7; Jul. 2012; pp. 3452-3463; doi: 10.1109/TPEL.2011.2182209.

Wrzecionko, B. et al.; "Novel Gate Driver for Normally-off SiC JFET and General High Temperature SiC Converter Technology"; Power Electronic Systems Laboratory; May 29, 2012; ISiCPEAW, Kista (S); 29 pages.

Umegami, H. et al.; "A Novel High Efficiency Gate Drive Circuit for Normally Off Type GaN-FET" 2012 IEEE Energy Conversion Congress and Exposition (ECCE), Raleigh, NC, 2012, pp. 2954-2960, doi: 10.1109/ECCE.2012.6342364.

Yoshida, T. et al.; "Gate Drive Circuit for Normally on Type GaN FET"; 2013 2nd International Conference on Electric Power Equipment—Switching Technology (ICEPE-ST), Matsue, Japan; 2013, pp. 1-4, doi: 10.1109/ICEPE-ST.2013.6804367.

Allan, R.; "SiC and GaN vs. IGBTs: The Imminent Tug of War for Supremacy"; Power Electronics; Jul. 27, 2017; 2 pages.

GaN Systems Inc.; GN001 Application Guide; "Design with GaN Enhancement mode HEMT"; Oct. 7, 2016; 46 pages.

* cited by examiner

Si-GaN Hybrid half-bridge and driver circuit

- The total power of four-phase is 3.5kW;
- Vin=48V, Vo=13.6V;
- L=6 µH;
- Frequency = 50kHz, 100kHz, 200kHz Inductor Current of Each Phase

Fig. 6

--- Test condition: $V_{ds}$ = 50V  $R_{gon}$ = 4.7Ω  $R_{goff}$ = 1 Ω

Fig. 7

| | Switching Frequency (kHz) | Total-Loss (W) | Conduction (W) | Switching-On (W) | Switching-Off (W) |
|---|---|---|---|---|---|
| GaN | 50.0 | 31.20 | 29.59 | 0.74 | 0.86 |
| Hybrid | 50.0 | 15.12 | 12.02 | 2.23 | 0.86 |
| Si | 50.0 | 22.22 | 6.15 | 7.45 | 8.62 |
| | Switching Frequency (kHz) | Total-Loss (W) | Conduction (W) | Switching-On (W) | Switching-Off (W) |
| GaN | 100.0 | 32.58 | 29.13 | 2.05 | 1.40 |
| Hybrid | 100.0 | 19.37 | 11.83 | 6.14 | 1.40 |
| Si | 100.0 | 40.52 | 6.05 | 20.47 | 14.00 |
| | Switching Frequency (kHz) | Total-Loss (W) | Conduction (W) | Switching-On (W) | Switching-Off (W) |
| GaN | 200.0 | 36.24 | 29.01 | 4.72 | 2.50 |
| Hybrid | 200.0 | 28.44 | 11.79 | 14.16 | 2.50 |
| Si | 200.0 | 78.24 | 6.03 | 47.19 | 25.01 |

Fig. 8

HYBRID POWER STAGE AND GATE DRIVER CIRCUIT

CROSS-REFERENCE TO RELATED APPLICATION(S)

n/a

TECHNICAL FIELD

This invention relates to a semiconductor power switching devices, such as power stages using half-bridge and full-bridge switching topologies, and driver circuits for semiconductor power switching devices.

BACKGROUND

Power stages, such as a half-bridge or full-bridge switch topologies, may be implemented using silicon (Si) technology, silicon carbide (SiC) technology, or gallium nitride (GaN) technology, for example. Si IGBT technology for power applications, i.e. using Si IGBTs (Insulated Gate Bipolar Transistors) with Si anti-parallel diodes, is well-established and offers reliable performance at low cost. Wide bandgap (WBG) semiconductor technologies, such as SiC and GaN technologies offer performance advantages, such as, higher efficiency, higher switching frequencies, and reduced losses, but add significantly to costs.

An article by R. Allan, entitled "SiC and GaN vs. IGBTs: The Imminent Tug of War for Supremacy" in Power Electronics, 27 Jul. 2017, provides a brief overview of the benefits of GaN HEMTs and SiC MOSFETs vs. Si IGBTs. Power applications span a wide range of voltages from low voltage, e.g. 100V to 300V for consumer electronics and power supplies; medium voltage, e.g. 650V to 1200V for applications such as EV/HEV traction inverters, PV inverters, motor controllers and UPS; and high voltage above 1700V, for applications such as smart power grid, wind power generation, and large-scale transport, e.g. rail and shipping. Thus, it is likely that each of Si, SiC and GaN technologies will continue to co-exist and offer complementary solutions for different automotive, industrial, consumer and other power applications.

Implementation of half-bridge and full-bridge switching topologies using GaN semiconductor technology comprising GaN power transistors for high-side and low-side switches offers performance advantages for many applications, but at a higher cost relative to Si and SiC technology. There is a need for more cost-effective power stages that take advantage of the switching performance of GaN power transistors.

SUMMARY OF INVENTION

The present invention seeks to provide a hybrid power switching stage and a driver circuit.

A first aspect of the invention provides a power semiconductor switching device comprising: a high-side switch and a low-side switch connected in a half-bridge configuration, wherein the high-side switch comprises at least one GaN power transistor and the low-side switch comprises at least one Si MOSFET;

a MOSFET half-bridge gate driver comprising a high-side driver and a low-side driver;

a gate drive output of the low-side driver being connected to the gate of the at least one Si MOSFET through a first gate drive circuit comprising a first gate resistor to provide a gate drive of a first voltage range for driving the Si MOSFET;

a gate drive output of the high-side driver being connected to the gate of the at least one GaN power transistor through a second gate drive circuit comprising a second gate resistor and a level shift circuit to provide a gate drive of a second voltage range for driving the GaN power transistor.

For example, the gate driver provides a first voltage range for driving the gate of the Si-MOSFET, and the second voltage range for driving the GaN-HEMT is level shifted to provide a positive turn-on gate voltage and a negative turn-off gate voltage.

For example, the gate driver may be a standard a 12V MOSFET gate driver, wherein the first voltage range for driving the Si-MOSFET is 0-12V, and the second voltage range for driving the GaN-HEMT is level shifted from 0-12V to provide a positive turn-on gate voltage and a negative turn-off gate voltage for the GaN-HEMT. For example, the second voltage range for driving the GaN-HEMT may be level shifted from 0-12V to a range of −6V to +6V.

The level shift circuit may comprise a capacitor in parallel with a resistor, which are connected in series between the gate resistor and the gate of the GaN power transistor, and a clamp circuit, e.g. comprising first and second diodes, connected between the gate of the power transistor and source of the GaN power transistor for clamping the positive turn-on gate voltage and the negative turn-off gate voltage.

A second aspect of the invention provides a gate driver for driving a power semiconductor switching device comprising a high-side switch and a low-side switch connected in a half-bridge configuration, wherein the high-side switch comprises a GaN power transistor and the low-side switch comprises a Si MOSFET, the gate driver comprising:

a MOSFET half-bridge driver comprising a high-side driver and a low-side driver;

the gate drive output of the low-side driver being connected to the gate of the Si MOSFET through a first gate drive circuit comprising a first gate resistor to provide a gate drive voltage output of a first voltage range for driving the Si MOSFET;

the gate drive output of the high-side driver being connected to the gate of the GaN power transistor through a second gate drive circuit comprising a second gate resistor and a level shift circuit to provide a gate drive voltage of a second voltage range for driving the GaN power transistor.

For example, the gate driver provides a first voltage range for driving the gate of the Si-MOSFET, and the second voltage range for driving the GaN-HEMT is level shifted to provide a positive turn-on gate voltage and a negative turn-off gate voltage.

Thus, semiconductor power switching devices of example embodiments comprise a hybrid power switching stage, comprising a GaN high-side switch and a Si MOSFET low-side switch, and driver circuits for hybrid power switching stages, such as half-bridge and full-bridge switch topologies. Power switching stages comprising said semiconductor power switching devices and driver circuits, are disclosed, that seek to provide at least one of enhanced performance and lower cost.

The foregoing and other features, aspects and advantages of the present invention will become more apparent from the following detailed description, taken in conjunction with the accompanying drawings, of some embodiments of the invention, which description is by way of example only.

DETAILED DESCRIPTION

Figure 1:
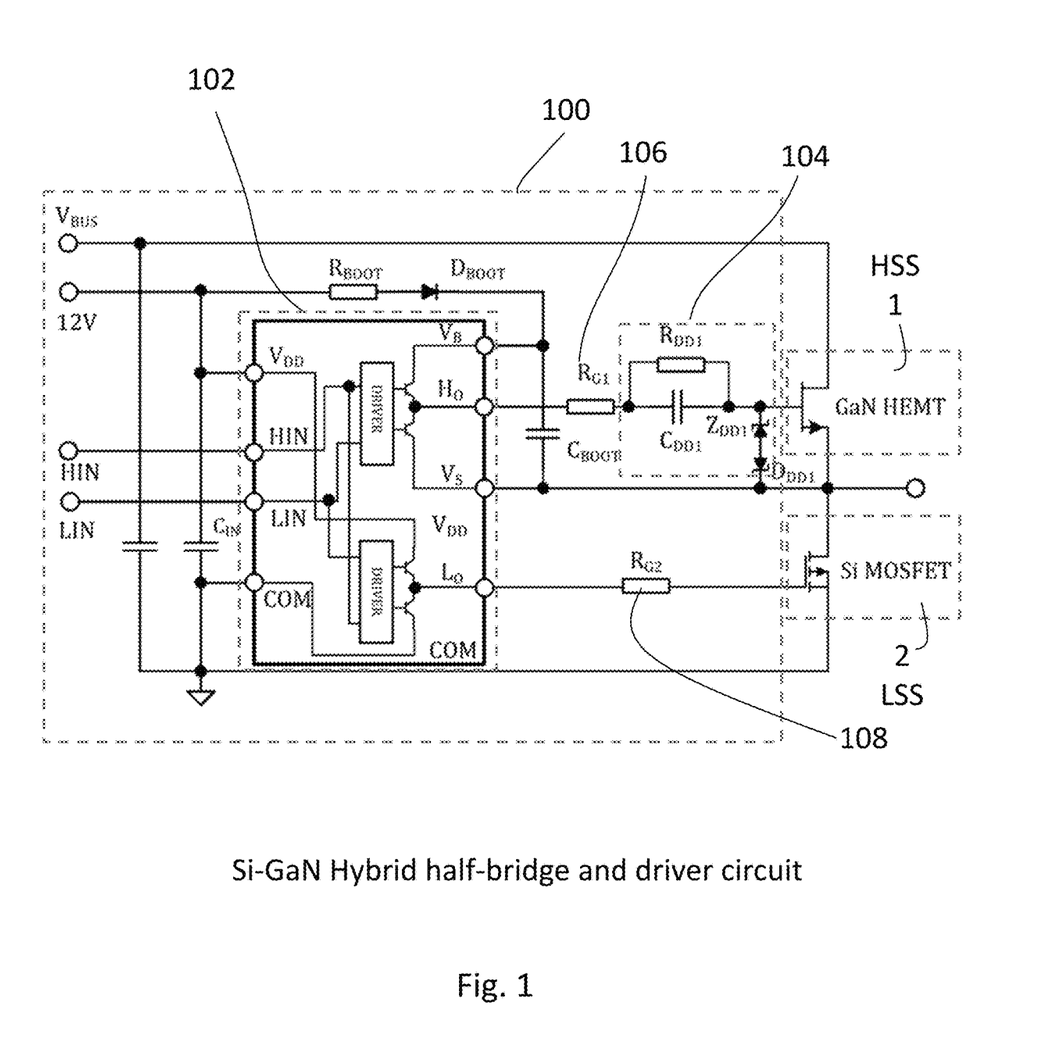
FIG. 1 shows a circuit schematic for a hybrid power stage comprising a hybrid Si—GaN half-bridge and driver circuit of an embodiment.

A circuit schematic for a power stage comprising a hybrid Si—GaN half-bridge and driver circuit is shown in FIG. 1. The high-side switch 1 (HSS) of the half-bridge comprises a GaN power transistor, such as a GaN HEMT and the low-side switch 2 (LSS) comprises a Si MOSFET. Of the two switches of a half-bridge, the high-side switch is used for hard switching and the low-side switch is used for soft switching. Thus, in this design, the GaN HEMT is used for hard switching and the Si MOSFET for soft switching. Since the gate voltage $V_{GS}$ requirements for driving the GaN HEMT and the Si MOSFET are different, the gate driver circuit 100 is configured to provide suitable gate drive signals for each of the GaN HEMT and the Si MOSFET from a single power source, e.g. a 12V power supply.

Figure 2:
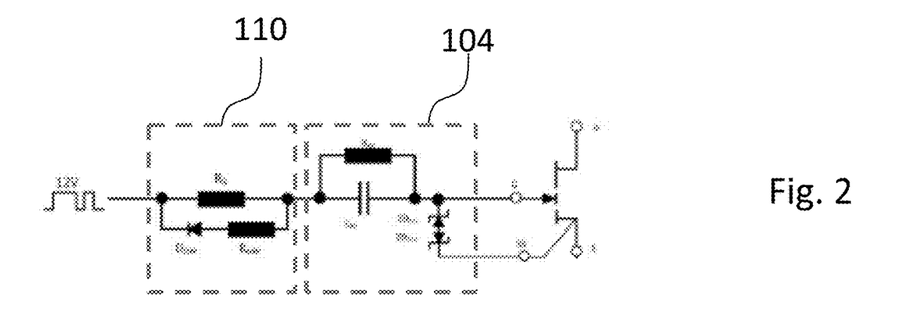
FIG. 2 shows an example gate driver circuit comprising a level shift circuit of the embodiment shown in FIG. 1.
Figure 3:
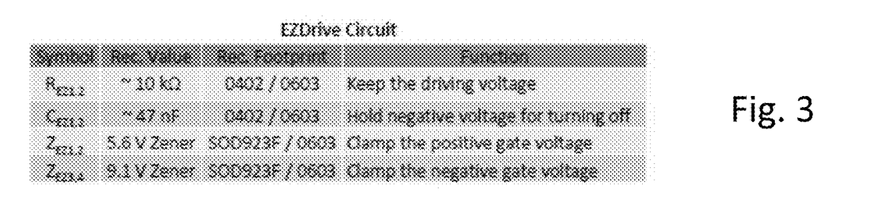
FIG. 3 shows a table with component values for the gate driver circuit of FIG. 2 selected for driving an example GaN-HEMT.
Figure 4:
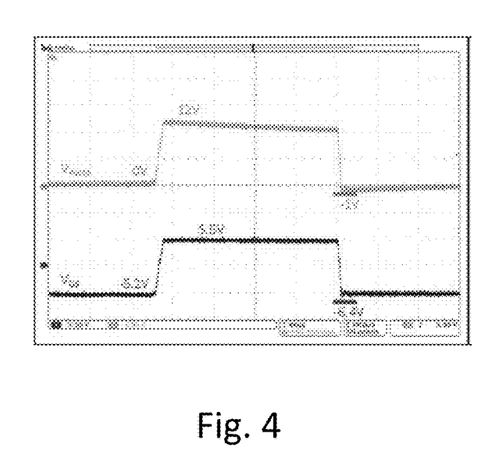
FIGS. 4 and 5 shows example waveforms for the gate driver circuit of FIG. 2.
Figure 5:
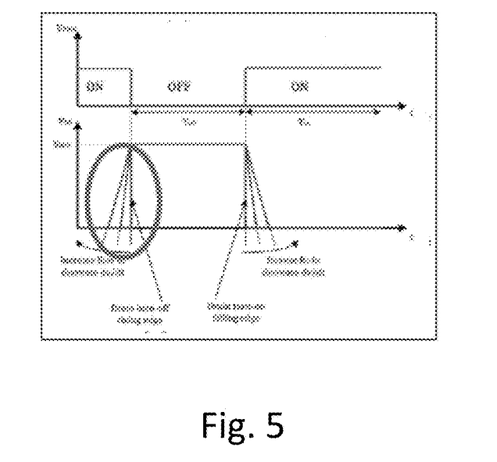

The gate driver circuit 100 comprises a half bridge driver 102, which may be a standard 12V MOSFET driver. The gate driver may be integrated with a driver controller. The output of the low-side driver $L_O$ is connected through a gate driver circuit, comprising a first gate resistor 108 ($R_{G2}$), to the gate of the Si MOSFET to provide a gate drive voltage in a first gate voltage range based on the supply voltage $V_{DD}$, e.g. 0 to 12V. The output of the high-side driver Ho is connected through a gate driver circuit comprising a second gate resistor 106 ($R_{G1}$) and a level shift circuit 104. For example, as illustrated the level shift circuit may comprise a GaN Systems EZDrive™ circuit comprising a capacitor Coo with parallel resistor $R_{DD1}$, which are connected between the gate resistor $R_{G1}$ and the gate of the GaN HEMT, and a clamp circuit, e.g. comprising a Zener diode Zoo' and diode Dom, for clamping the turn-in and turn-off gate drive voltages. The EZDrive circuit provides a drive voltage level shift. For example, when a negative gate voltage is to be used for turn-off of the GaN HEMT, by appropriate selection of components of the EZDrive circuit, a required gate drive voltage for the GaN HEMT, e.g. −6V to +6V can be generated by a voltage level shift from the 0-12V power supply voltage. The low-side driver circuit provides a gate drive voltage of e.g. 0V to 12V, i.e. without level shift, for the Si MOSFET through gate resistor $R_{G2}$. FIG. 2 shows an enlarged view of the gate drive circuit with level shift 104 for driving the GaN HEMT. FIG. 3 shows some example component values for driving the GaN HEMT, and FIGS. 4 and 5 shows example waveforms.

This gate driver circuit enables a standard MOSFET driver to provide a low-side gate drive of a first voltage range for driving the Si MOSFET, and a high-side gate drive of a second voltage range for driving the GaN power transistor. For example, the first voltage range for driving the Si-MOSFET is a range from 0V to $V_{DD}$, and the second voltage range for driving the GaN-HEMT is level shifted to provide a positive turn-on gate voltage and a negative turn-off gate voltage.

Figure 6:
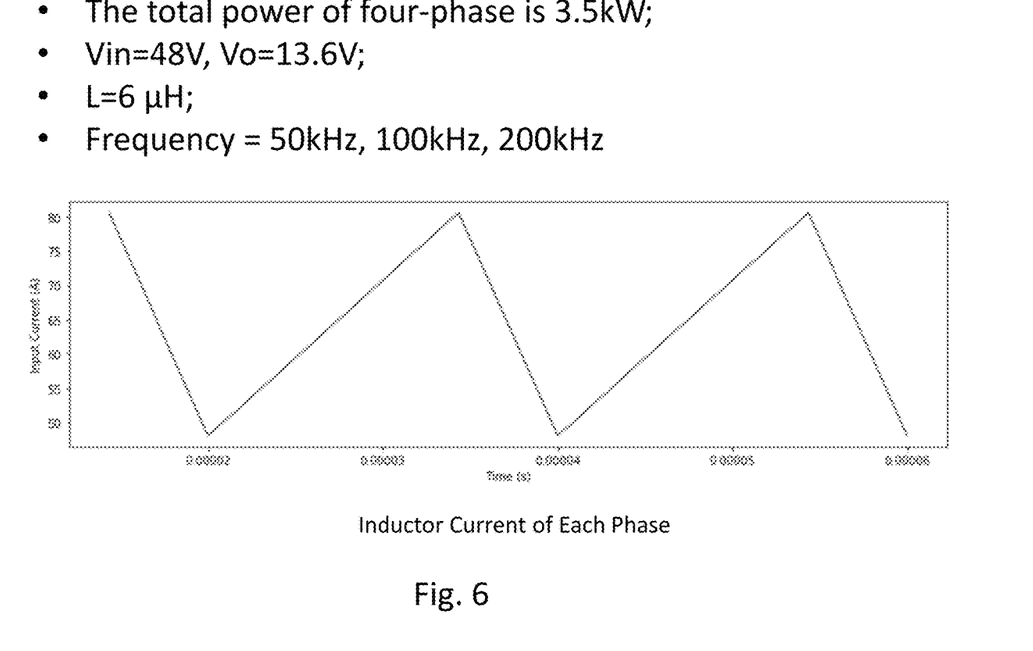
FIG. 6 shows an example plot of the inductor current of each phase of an example four-phase half-bridge power stage, as a function of time.

By way of example only, test results are presented for a four-phase half-bridge for a Si—GaN hybrid half-bridge wherein the high-side switch comprises a GaN Systems GS61008P GaN HEMT and the low-side switch comprises an Infineon OptiMOS™5 Si MOSFET. The GS61008P GaN HEMT has an on-state resistance $R_{on}$ of 7 mΩ. A 1.2 mΩ Si MOSFET was selected for the low-side switch. These devices are rated for 100V operation. As an example, the total power of the four-phase half-bridge is 3.5 kW, with an input voltage Vin of 48V, and an output voltage $V_o$ of 13.6V, and an inductance of 6 µH, for switching frequencies of 50 kHz, 100 kHz and 200 kHz. FIG. 6 shows an example waveform for the inductor current of one phase as a function of time for a switching frequency of 50 kHz.

Figure 7:
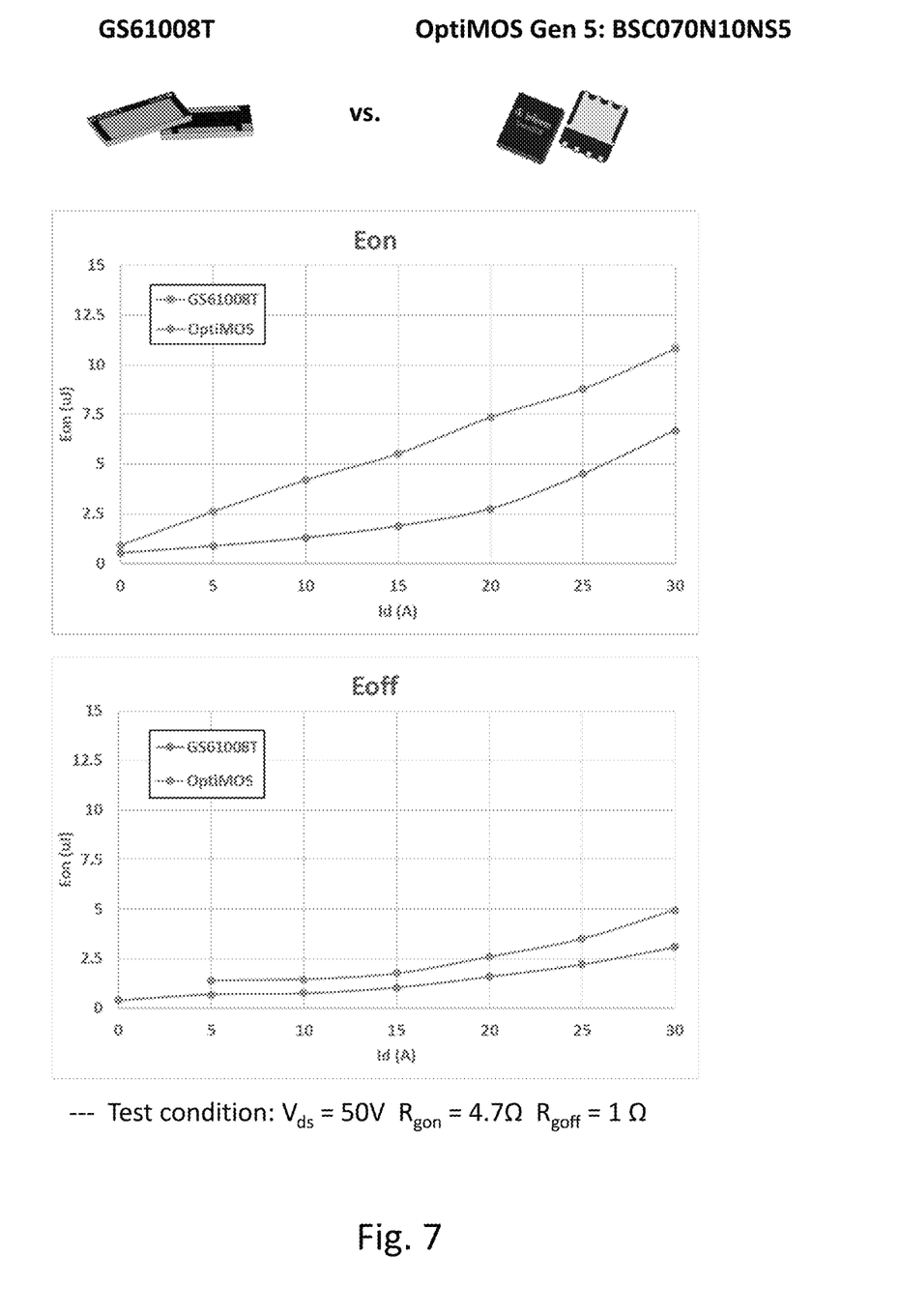
FIG. 7 shows plots of switching energy losses $E_{on}$ and $E_{off}$ as a function of drain current $I_d$ for a hybrid power stage comprising a hybrid Si—GaN half-bridge and driver circuit of an example embodiment.

FIG. 7 shows example test results for the on-switching energy loss and the off-switching energy loss for a Si—GaN hybrid half-bridge comprising a GS61008T GaN HEMT and an OptiMOS BSC070N10NS5 Si MOSFET, for test conditions of $V_{DS}$=50V, $R_{Gon}$=4.7Ω and $R_{Goff}$=1Ω. A GaN HEMT having an on-resistance $R_{DSon}$ of 7 mΩ has about one third of switching energies $E_{on}$ and $E_{off}$ compared to a Si MOSFET of the same on-resistance. Compared with a 2.1 mΩ GaN HEMT, a 7 mΩ GaN HEMT will have switching energies about 10 times smaller.

Figure 8:
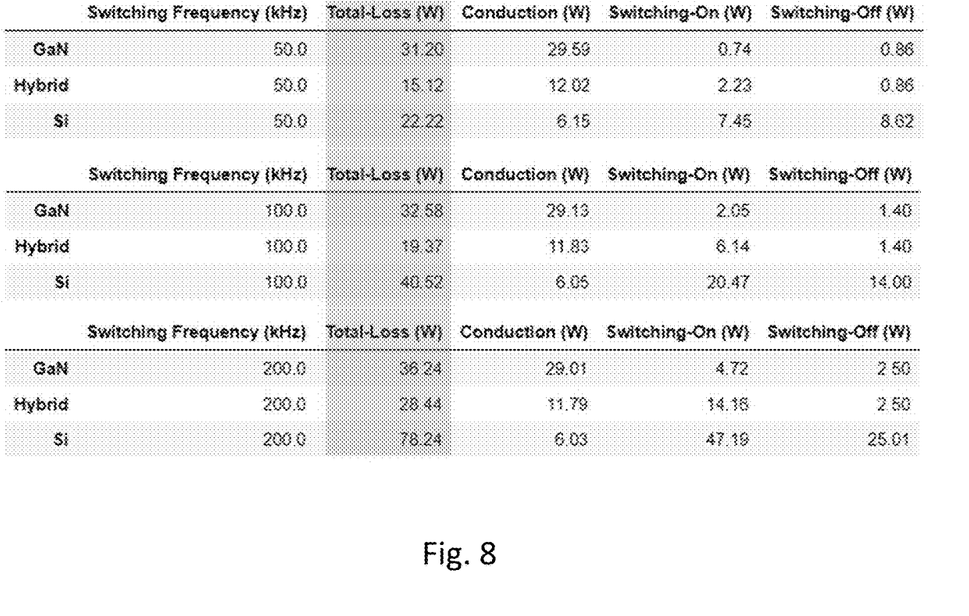
FIG. 8 shows a data table comparing performance of power stages comprising a GaN half-bridge, a hybrid Si—GaN half-bridge, and a Si half-bridge, for switching frequencies of 50 kHz, 100 kHz and 200 kHz.

The test results for the Si—GaN hybrid half-bridge are compared with the test results for a pure GaN implementation using GS61008P GaN HEMTs for both the high-side and low-side switches, and a pure Si implementation using OptiMOS5 Si MOSFETs for both the high-side and low-side switches (2.1 mΩ and 1.2 mΩ). Some example test data are shown in the table in FIG. 8 to compare the Si—GaN hybrid half-bridge performance with the pure GaN and pure Si implementations, for different switching frequencies of 50 kHz, 100 kHz and 200 kHz. These results demonstrate that the Si—GaN hybrid solution combines the advantages of Si and GaN and offers best performance, in terms of total losses at each of these switching frequencies. Relative to a pure GaN implementation, the pure Si implementation has higher on-switching and off-switching energies $E_{on}$ and $E_{off}$ but offers significantly lower conduction losses. The Si—GaN hybrid solutions offers an $E_{off}$ of 0.86 W, an $E_o$n of 2.23 W and conduction losses of 12.02 W.

For this 100V hybrid Si—GaN half-bridge application it is demonstrated that the reverse recovery of the 100V OptiMOS Si MOSFET is acceptable and use of the Si MOSFET for freewheeling does not significantly compromise the performance of the GaN HEMT. Use of a Si MOSFET for freewheeling substantially reduces the system cost for power stages comprising half-bridge and full-bridge switching topologies.

Although the GaN HEMT and Si MOSFET have different drive voltage $V_{GS}$ requirements, a low cost driver circuit is disclosed which uses a single power supply, e.g. 0 to 12V, for generating a required gate drive voltages with a positive turn-on voltage and a negative turn-off voltage for the GaN HEMT, e.g. −6V to +6V for the GaN HEMT, and a conventional 0 to 12V gate drive for the Si MOSFET.

This gate driver circuit has applications for power switching devices wherein a high-side switch comprises a GaN power transistor and a low-side switch comprises a Si MOSFET, e.g. half-bridge and full-bridge power switching stages, which offer at least one of improved performance and lower cost. The low-side switch may comprise a plurality of Si MOSFETs connected in parallel. The high-side switch may comprise a plurality of GaN power transistors connected in parallel.

Although embodiments of the invention have been described and illustrated in detail, it is to be clearly understood that the same is by way of illustration and example only and not to be taken by way of limitation, the scope of the present invention being limited only by the appended claims.

The invention claimed is:

1. A power semiconductor switching stage comprising:
   a hybrid power semiconductor switching device comprising: a high-side switch and a low-side switch connected in series in a half-bridge configuration, wherein:
   the high-side switch is a Gallium Nitride (GaN) semiconductor power switching device implemented with at least one transistor, wherein every transistor of the high-side switch is an enhancement-mode GaN power transistor having a source, a drain and a gate; and
   the low-side switch is a Silicon (Si) semiconductor power switching device implemented with at least one transistor, wherein every transistor of the low-side switch is an enhancement-mode Si MOSFET having a source, a drain and a gate;
   the drain of every GaN power transistor is connected to a DC bus, the source of every GaN power transistor is connected to a switch node, the drain of every Si MOSFET is connected to the switch node, and the source of every Si MOSFET is connected to a source bus;
   a MOSFET half-bridge gate driver comprising a high-side driver and a low-side driver;
   a gate drive output of the low-side driver being connected to the gate of every Si MOSFET through a first gate drive circuit comprising a gate resistor to provide a gate drive of a first voltage range for driving every Si MOSFET;
   a gate drive output of the high-side driver being connected to the gate of every GaN power transistor through a second gate drive circuit comprising a gate resistor and a voltage level shift circuit to provide a gate drive of a second voltage range for driving every GaN power transistor.

2. The power semiconductor switching stage of claim 1, wherein the low-side switch comprises a plurality of Si MOSFETs connected in parallel.

3. The power semiconductor switching stage of claim 1, wherein the high-side switch comprises a plurality of GaN power transistors connected in parallel.

4. The power semiconductor switching stage of claim 1 wherein, for a supply voltage $V_{DD}$, said first voltage range for driving every Si MOSFET is a range from 0V to $V_{DD}$, and the second voltage range for driving every GaN power transistor is level shifted to provide a positive turn-on gate voltage and a negative turn-off gate voltage.

5. The power semiconductor switching stage of claim 4, wherein the voltage level shift circuit comprises a capacitor in parallel with a resistor, connected in series between the gate resistor and the gate of every GaN power transistor, and a clamp circuit connected between the gate of every GaN power transistor and the source of every GaN power transistor for clamping the positive turn-on gate voltage and the negative turn-off gate voltage.

6. The power semiconductor switching stage of claim 5, wherein the clamp circuit comprises a diode clamp.

7. The power semiconductor switching stage of claim 1, which is part of a half-bridge or full-bridge power switching stage.

8. The power semiconductor switching stage of claim 1, wherein every GaN power transistor is a GaN HEMT.

9. The power semiconductor switching stage of claim 1, wherein said MOSFET half-bridge gate driver is integrated with a driver controller.

10. A gate driver for a hybrid power switching device comprising a high-side switch and a low-side switch connected in series in a half-bridge configuration, wherein: the high-side switch is a Gallium Nitride (GaN) semiconductor power switching device implemented with at least one transistor, wherein every transistor of the high-side switch is an enhancement mode GaN power transistor having a source, a drain and a gate; and the low-side switch is an enhancement-mode Silicon (Si) semiconductor power switching device implemented with at least one transistor, wherein every power transistor of the low-side switch is a Si MOSFET having a source, a drain and a gate; the drain of every GaN power transistor is connected to a DC bus, the source of every GaN power transistor is connected to a switch node, the drain of every Si MOSFET is connected to the switch node, and the source of every Si MOSFET is connected to a source bus; the gate driver comprising:
   a half-bridge driver comprising a high-side driver and a low-side driver;
   a gate drive output of the low-side driver being connected through a first gate drive circuit comprising a first gate resistor to provide a gate drive voltage output of a first voltage range for driving the gate of every Si MOSFET of the low-side switch;
   a gate drive output of the high-side driver being connected through a second gate drive circuit comprising a gate resistor and a voltage level shift circuit to provide a gate drive voltage output of a second voltage range for driving the gate of every GaN transistor of the high-side switch.

11. The gate driver of claim 10, wherein for a supply voltage $V_{DD}$, the first voltage range for driving the Si semiconductor power switching device is in a range from 0V to $V_{DD}$ and the second voltage range for driving the GaN semiconductor power switching device is level shifted to provide a positive turn-on gate voltage and a negative turn-off gate voltage.

12. The gate driver of claim 11, wherein the level shift circuit comprises a capacitor in parallel with a resistor, connected in series between the gate resistor and the gate of every GaN power transitor, and a clamp circuit connected between the gate of every GaN power transistor and the source of every GaN power transistor for clamping the positive turn-on gate voltage and the negative turn-off gate voltage.

13. The gate driver of claim 12, wherein the clamp circuit comprises a diode clamp.

14. The gate driver of claim 10, integrated with a driver controller.

15. A power semiconductor switching stage comprising:
   a hybrid power semiconductor switching device comprising: a high-side switch and a low-side switch connected in series in a half-bridge configuration, wherein:

the high-side switch is a Gallium Nitride (GaN) semiconductor power switching device, implemented with a plurality of power transistors connected in parallel, wherein every power transistor of the high-side switch is an enhancement-mode GaN power transistor, having a drain, a source and a gate;

the low-side switch is a Silicon (Si) semiconductor power switching device, implemented with a plurality of power transistors connected in parallel, wherein every power transistor of the low-side switch is an enhancement-mode Si MOSFET, having a drain, a source and a gate;

the drain of every GaN power transistor is connected to a DC bus, the source of every GaN power transistor is connected to a switch node, the drain of every Si MOSFET is connected to the common switch node, and the source of every Si MOSFET is connected to a source bus;

a gate driver comprising a MOSFET half-bridge gate driver comprising a high-side driver and a low-side driver;

a gate drive output of the low-side driver being connected to the gate of every Si MOSFET through a first gate drive circuit comprising a gate resistor to provide a gate drive of a first voltage range for driving the plurality of Si MOSFETs;

a gate drive output of the high-side driver being connected to the gate of every GaN power transistor through a second gate drive circuit comprising a gate resistor and a voltage level shift circuit to provide a gate drive of a second voltage range, different from the first voltage range, for driving the plurality of GaN power transistors.

16. The power semiconductor switching stage of claim 15 wherein, for a power supply voltage $V_{DD}$, said first voltage range for driving the plurality of Si MOSFETs is in a range from 0V to $V_{DD}$, and the second voltage range for driving the plurality of GaN power transistors is level shifted to provide a negative turn-off gate voltage and a positive turn-on gate voltage.

17. A power semiconductor switching stage comprising:
a hybrid power semiconductor switching device comprising: a high-side switch and a low-side switch connected in series in a half-bridge configuration, wherein:
the high-side switch is implemented with at least one transistor, wherein every transistor of the high-side switch is a GaN power transistor, having a drain, a source and a gate; and
the low-side switch is implemented with at least one transistor, wherein every transistor of the low-side switch is a Si MOSFET having a drain, a source and a gate;
the drain of every GaN power transistor is connected to a DC bus, the source of every GaN power transistor is connected to a phase node, the drain of every Si MOSFET is connected to the phase node, and the source of every Si MOSFET is connected to a source bus;
a MOSFET half-bridge gate driver comprising a high-side driver and a low-side driver;
a gate drive output of the low-side driver being connected to the gate of every Si MOSFET of the low-side switch through a first gate drive circuit comprising a first gate resistor to provide a gate drive of a first voltage range for driving every Si MOSFET;
a gate drive output of the high-side driver being connected to the gate of every GaN power transistor of the high-side switch through a second gate drive circuit comprising a second gate resistor and a voltage level shift circuit to provide a gate drive of a second voltage range for driving every GaN power transistor;
wherein for a supply voltage $V_{DD}$, said first voltage range for driving every Si MOSFET is in a range from 0V to $V_{DD}$, and the second voltage range for driving every GaN power transistor is level shifted to provide a positive turn-on gate voltage and a negative turn-off gate voltage.

* * * * *

UNITED STATES PATENT AND TRADEMARK OFFICE
CERTIFICATE OF CORRECTION

PATENT NO. : 11,677,396 B2
APPLICATION NO. : 17/123316
DATED : June 13, 2023
INVENTOR(S) : Juncheng Lu and Larry Spaziani It is certified that error appears in the above-identified patent and that said Letters Patent is hereby corrected as shown below:

In the Claims

In Claim 12 (Column 6, Line 55): "transitor" should read -- transistor --

In Claim 15 (Column 7, Line 16): "MOSFET is connected to the common switch node, and" should read -- MOSFET is connected to the switch node, and --

Signed and Sealed this
Seventeenth Day of October, 2023

Katherine Kelly Vidal
*Director of the United States Patent and Trademark Office*